(12) United States Patent
Matsuo et al.

(10) Patent No.: US 11,127,762 B2
(45) Date of Patent: Sep. 21, 2021

(54) SEMICONDUCTOR DEVICE AND DISPLAY INCLUDING WIRING LINE HAVING PROTECTIVE METAL FILM

(71) Applicant: JOLED INC., Tokyo (JP)

(72) Inventors: Eri Matsuo, Tokyo (JP); Yasuhiro Terai, Tokyo (JP)

(73) Assignee: JOLED INC., Tokyo (JP)

( * ) Notice: Subject to any disclaimer, the term of this patent is extended or adjusted under 35 U.S.C. 154(b) by 246 days.

(21) Appl. No.: 16/518,386

(22) Filed: Jul. 22, 2019

(65) Prior Publication Data

US 2020/0266219 A1 Aug. 20, 2020

(30) Foreign Application Priority Data

Feb. 20, 2019 (JP) .............................. JP2019-028466

(51) Int. Cl.
*H01L 27/12* (2006.01)
*H01L 29/786* (2006.01)
*H01L 29/66* (2006.01)

(52) U.S. Cl.
CPC ...... *H01L 27/1225* (2013.01); *H01L 27/1259* (2013.01); *H01L 29/66969* (2013.01); *H01L 29/7869* (2013.01)

(58) Field of Classification Search
CPC ........... H01L 29/7869; H01L 29/66969; H01L 27/1259; H01L 27/1222; H01L 27/124; H01L 27/1244

See application file for complete search history.

(56) References Cited

U.S. PATENT DOCUMENTS

| 2013/0299817 A1* | 11/2013 | Park | H01L 29/78618 257/43 |
| 2015/0152399 A1 | 6/2015 | Sato | |
| 2016/0133657 A1* | 5/2016 | Hong | H01L 23/3171 438/23 |
| 2016/0197192 A1* | 7/2016 | Kang | H01L 23/53233 257/43 |

FOREIGN PATENT DOCUMENTS

JP 2015-108731 A 6/2015

* cited by examiner

*Primary Examiner* — Matthew E. Gordon
(74) *Attorney, Agent, or Firm* — Hauptman Ham, LLP

(57) ABSTRACT

A semiconductor device includes a semiconductor film, a semiconductor auxiliary film, a wiring line, a first metal film, and an interlayer insulating film. The semiconductor film includes a channel region and a low-resistance region. The semiconductor film includes indium and oxygen. The semiconductor auxiliary film is in contact with the low-resistance region of the semiconductor film and reduces the electric resistance of the semiconductor film. The wiring line is electrically coupled to the low-resistance region of the semiconductor film. The first metal film covers the wiring line and has a higher standard electrode potential than the indium. The interlayer insulating film covers the semiconductor film with the first metal film interposed therebetween. The interlayer insulating film has a first hole and a second hole. The first hole is provided at a position opposed to the low-resistance region of the semiconductor film. The second hole reaches the first metal film.

13 Claims, 7 Drawing Sheets

| SIMPLE SUBSTANCE | STANDARD ELECTRODE POTENTIAL (V) |
|---|---|
| Li | -3.045 |
| K | -2.925 |
| Ca | -2.840 |
| Na | -2.714 |
| Mg | -2.356 |
| Al | -1.676 |
| Ti | -1.63 |
| Zn | -0.763 |
| Fe | -0.440 |
| In | -0.338 |
| Ni | -0.257 |
| Mo | -0.2 |
| Sn | -0.138 |
| Pb | -0.126 |
| H | 0.000 |
| Cu | 0.340 |
| Hg | 0.796 |
| Ag | 0.799 |
| Pt | 1.188 |
| Au | 1.520 |

FIG. 2

SEMICONDUCTOR DEVICE AND DISPLAY INCLUDING WIRING LINE HAVING PROTECTIVE METAL FILM

CROSS REFERENCE TO RELATED APPLICATIONS

This application claims the benefit of Japanese Priority Patent Application No. 2019-028466 filed on Feb. 20, 2019, the entire contents of which are incorporated herein by reference.

BACKGROUND

The technology relates to a semiconductor device including an oxide semiconductor material, and a display that includes the semiconductor device.

In recent years, displays have increasingly higher definition of pixels. A thin-film transistor (TFT) is used for driving such a display. For example, development of a thin-film transistor that includes an oxide semiconductor material is becoming more active. Reference is made to Japanese Unexamined Patent Application Publication No. 2015-108731, for example.

SUMMARY

A semiconductor device including such a thin-film transistor can deteriorate in characteristics because of a manufacturing process, for example.

It is desirable to provide a semiconductor device that makes it possible to suppress deterioration in characteristics, and a display that includes such a semiconductor device.

According to one embodiment of the technology, there is provided a semiconductor device including a semiconductor film, a semiconductor auxiliary film, a wiring line, a first metal film, and an interlayer insulating film. The semiconductor film includes a channel region and a low-resistance region having a lower electric resistance than the channel region. The semiconductor film includes indium and oxygen. The semiconductor auxiliary film is in contact with the low-resistance region of the semiconductor film and reduces the electric resistance of the semiconductor film. The wiring line is electrically coupled to the low-resistance region of the semiconductor film. The first metal film covers the wiring line and has a standard electrode potential higher than a standard electrode potential of the indium. The interlayer insulating film covers the semiconductor film with the first metal film interposed between the interlayer insulating film and the semiconductor film. The interlayer insulating film has a first hole and a second hole. The first hole is provided at a position opposed to the low-resistance region of the semiconductor film. The second hole reaches the first metal film.

According to one embodiment of the technology, there is provided a display with a display element and a semiconductor device that drives the display element. The semiconductor device includes a semiconductor film, a semiconductor auxiliary film, a wiring line, a first metal film, and an interlayer insulating film. The semiconductor film includes a channel region and a low-resistance region having a lower electric resistance than the channel region. The semiconductor film includes indium and oxygen. The semiconductor auxiliary film is in contact with the low-resistance region of the semiconductor film and reduces the electric resistance of the semiconductor film. The wiring line is electrically coupled to the low-resistance region of the semiconductor film. The first metal film covers the wiring line and has a standard electrode potential higher than a standard electrode potential of the indium. The interlayer insulating film covers the semiconductor film with the first metal film interposed between the interlayer insulating film and the semiconductor film. The interlayer insulating film has a first hole and a second hole. The first hole is provided at a position opposed to the low-resistance region of the semiconductor film. The second hole reaches the first metal film.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

FIG. 2 illustrates standard electrode potentials of typical simple substances.

DETAILED DESCRIPTION

Figure 1:
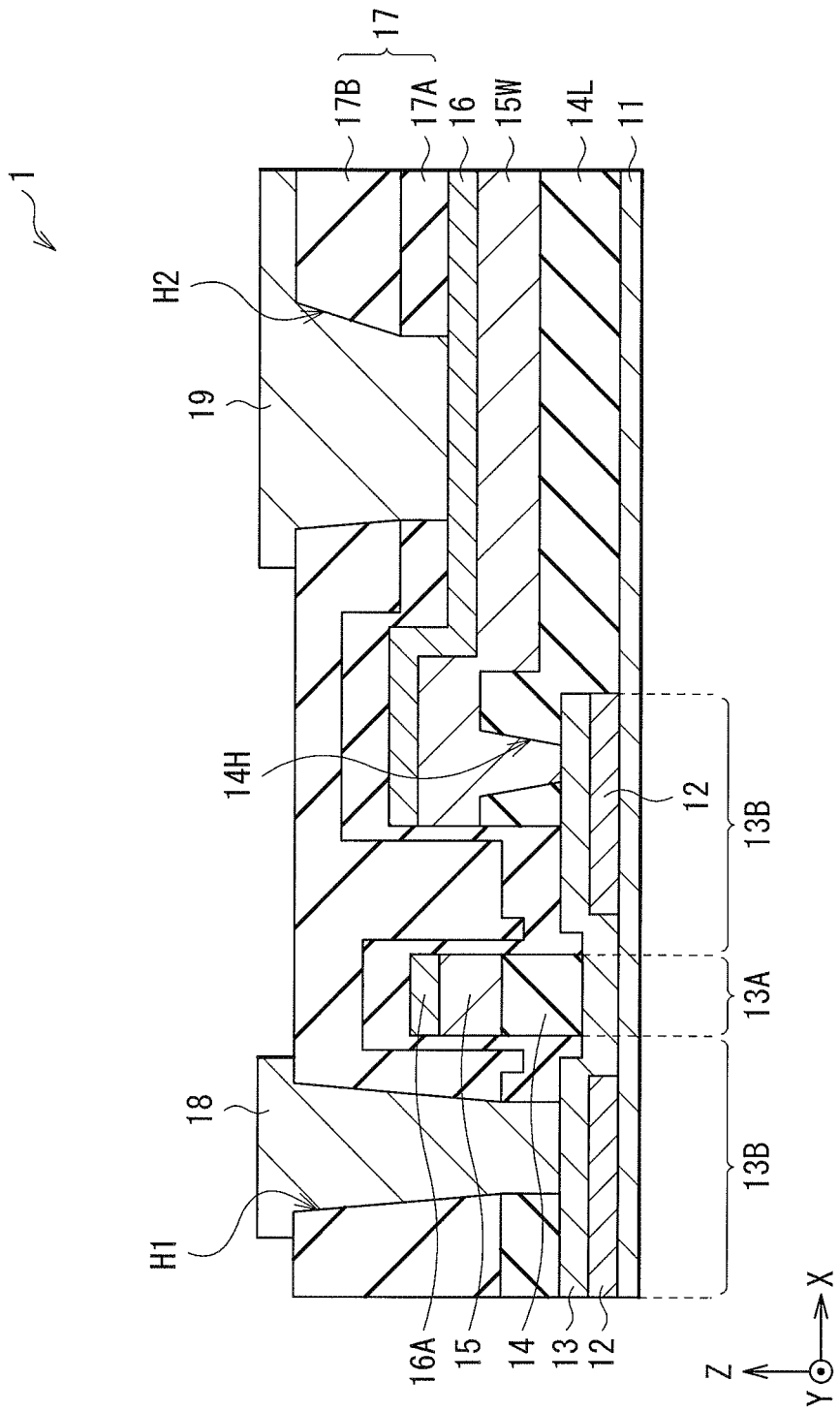
FIG. 1 is a schematic cross-sectional diagram illustrating an example configuration of a main part of a semiconductor device according to one embodiment of the technology.

Some example embodiments of the technology will now be described in detail with reference to the attached drawings. Note that the description is given in the following order.
1. Embodiment (Example Semiconductor Device Including Metal Film Covering Wiring Line)
2. Application Example 1 (Example Display and Example Imaging Unit)
3. Application Example 2 (Example Electronic Apparatus)

In the following, some example embodiments of the technology are described in detail, in the following order, with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail.

First Embodiment

[Configuration]

FIG. 1 schematically illustrates an example cross-sectional configuration of a main part of a semiconductor device (a semiconductor device 1) according to one embodiment of the technology. The semiconductor device 1 may be used in a driving circuit for a display and an imaging unit, for example. An example of the display may include a display 2A illustrated in FIG. 7 described below. An example of the imaging unit may include an imaging unit 2B illustrated in FIG. 8 described below. The semiconductor device 1 may include semiconductor auxiliary films 12, a semiconductor film 13, a gate insulating film 14, a gate electrode 15, a metal film 16A, an interlayer insulating film 17, and a source-drain electrode 18 that are provided in this order on a substrate 11. In other words, the semiconductor device 1 may include a top-gate thin-film transistor. The semiconductor device 1 may further include a wiring line 15W and a lead-out wiring line 19 that are electrically coupled to the thin-film transistor. Between the semiconductor film 13 (or the substrate 11) and the wiring line 15W may be provided an insulating film 14L, and the wiring line 15W is covered with the metal film 16. Here, the metal film 16 may correspond to a specific but non-limiting example of a "first metal film" according to one embodiment of the technology, and the metal film 16A may correspond to a specific but non-limiting example of a "second metal film" according to one embodiment of the technology.

The semiconductor film 13 may include a channel region 13A of the thin-film transistor. The channel region 13A may be opposed to the gate electrode 15. The low-resistance regions 13B may be provided adjacent to respective sides of the channel region 13A. The low-resistance regions 13B may each have an electric resistance lower than that of the channel region 13A. In other words, the semiconductor device 1 may include a thin-film transistor having a self-aligned structure.

The interlayer insulating film 17 is provided with holes H1 and H2 that may extend through the interlayer insulating film 17. The source-drain electrode 18 may be coupled to the semiconductor film 13 (in one example, the low-resistance regions 13B) via the hole H1. The lead-out wiring line 19 may be coupled to the wiring line 15W via the hole H2. Each part of the semiconductor device 1 is described below.

The substrate 11 may include, for example, glass, quartz, or silicon. Alternatively, the substrate 11 may include a resin material, such as polyethylene terephthalate (PET), polyimide (PI), polycarbonate (PC), or polyethylene naphthalate (PEN). Still alternatively, the substrate 11 may be a metal plate, such as stainless steel (SUS), on which an insulating material film is provided, for example.

The semiconductor auxiliary films 12 between the substrate 11 and the semiconductor film 13 may be provided in selective regions on the substrate 11. In one example, the semiconductor auxiliary films 12 may be provided in regions overlapping the low-resistance regions 13B of the semiconductor film 13 in plan view (a view along an XY plane in FIG. 1). In this example, the semiconductor auxiliary films 12 may be in contact with a lower surface (a surface on the substrate 11 side) of the semiconductor film 13. No semiconductor auxiliary film 12 may be provided in a region overlapping the channel region 13A of the semiconductor film 13 in plan view. In other words, the semiconductor auxiliary films 12 may be selectively disposed in portions opposed to the low-resistance regions 13B out of the channel region 13A and the low-resistance regions 13B of the semiconductor film 13. The semiconductor auxiliary films 12 may be provided in the entire regions overlapping the low-resistance regions 13B of the semiconductor film 13 in plan view. Alternatively, the semiconductor auxiliary films 12 may be provided partially in the regions overlapping the low-resistance regions 13B of the semiconductor film 13 in plan view.

The semiconductor auxiliary films 12 are selectively in contact with the low-resistance regions 13B within the semiconductor film 13. Thus, the semiconductor auxiliary films 12 may reduce electric resistance of the low-resistance regions 13B, in other words, cause the low-resistance regions 13B to have low resistance. In one example, the semiconductor auxiliary films 12 may have a carrier-supplying property with respect to the semiconductor film 13, and supply carriers to the low-resistance regions 13B. This makes it possible to enhance electrical conductivity of the low-resistance regions 13B, and reduce resistance of the low-resistance regions 13B. In another example, the semiconductor auxiliary films 12 may have electrical conductivity. This allows the semiconductor auxiliary films 12 themselves to serve as conductors, causing an electrical current to flow through the semiconductor auxiliary films 12 as well as the semiconductor film 13 in the low-resistance regions 13B. This enables the low-resistance regions 13B to have low resistance.

Such a semiconductor auxiliary film 12 may include a metal oxide, for example. In one example, the semiconductor auxiliary film 12 may include, without limitation, indium tin oxide (ITO) or indium zinc oxide (IZO). For example, the semiconductor auxiliary film 12 and the semiconductor film 13 may both include indium (In). The indium in the semiconductor auxiliary film 12 may have a higher concentration than the indium in the semiconductor film 13. The semiconductor auxiliary film 12 may have a low resistance. Here, tin (Sn) or zinc (Zn) added to indium oxide (InO) increases carrier density of the oxide to reduce resistance. However, adding tin or zinc excessively to indium oxide can result in reduced mobility in the oxide due to impurity scattering, for example. The semiconductor auxiliary film 12 may include, for example, indium with a concentration of about 70% to about 90%. In one example where the semiconductor film 13 includes IGZO, the IGZO may have a composition ratio of about In:Ga:Zn=1:1:1. Alternatively, the semiconductor auxiliary film 12 may include a metal, such as an aluminum-silicon alloy (AlSi) or aluminum (Al). The semiconductor auxiliary film 12 may have a thickness of about 5 nm to about 25 nm, for example. Providing such semiconductor auxiliary films 12 having a carrier-supplying property and electrical conductivity enables electric resistance of the low-resistance regions 13B to be stably maintained low. Moreover, even if over-etching in forming the hole H1 makes the semiconductor film 13 thin, the semiconductor auxiliary films 12 enables a reduction in electrical conductivity of the low-resistance regions 13B to be suppressed.

An undercoat (UC) film may be provided between the substrate 11 and the semiconductor auxiliary films 12 or between the substrate 11 and the semiconductor film 13. The UC film may suppress or prevent substances, such as sodium ions, from migrating from the substrate 11 toward an upper layer. The UC film may include an insulating material, such as silicon nitride (SiN) or silicon oxide (SiO).

The semiconductor film 13 may be provided in a selective region on the substrate 11 to cover the semiconductor auxiliary films 12. The semiconductor film 13 includes an oxide semiconductor containing at least indium (In) and oxygen (O). The semiconductor film 13 may include, in addition to indium, one or more elements including gallium (Ga), zinc (Zn), tin (Sn), titanium (Ti), and niobium (Nb). Specific but non-limiting examples of the material of the semiconductor film 13 may include indium-tin-zinc oxide (ITZO), indium-gallium-zinc oxide (IGZO: InGaZnO), indium-zinc oxide (IZO), indium-gallium oxide (IGO), indium-tin oxide (ITO), and indium oxide (InO). The semiconductor film 13 may have a thickness in a range from 10 nm to 300 nm, for example. In one example, the semiconductor film 13 may have a thickness of 60 nm or less. In the example embodiment of the technology, as the thickness of the semiconductor film 13 is reduced, defects in the semiconductor is reduced in absolute amount, which suppresses a negative shift of a threshold voltage. This enables achievement of the thin-film transistor having an excellent characteristic, such as a high on/off ratio. Furthermore, this reduces a time taken for the formation of the semiconductor film 13, resulting in an improvement in productivity.

The low-resistance regions 13B of the semiconductor film 13 may be adjacent to the respective sides of the channel region 13A. One of the low-resistance regions 13B may be coupled to the source-drain electrode 18. Another of the low-resistance regions 13B is coupled to the wiring line 15W.

The gate insulating film 14 provided between the semiconductor film 13 (the channel region 13A) and the gate electrode 15 may have the same shape as the gate electrode 15 in plan view, for example. The gate insulating film 14 having such a shape enables the thin-film transistor to have a self-aligned structure. The gate insulating film 14 may be a single-layer film that includes one of materials including silicon oxide (SiO), silicon nitride (SiN), silicon oxide nitride (SiON), and aluminum oxide (AlO). Alternatively, the gate insulating film 14 may be a multi-layer film that includes two or more these materials.

The insulating film 14L may be, for example, formed in the same process as the gate insulating film 14. In other words, the insulating film 14L may be formed at the same time as the gate insulating film 14. The insulating film 14L may be provided between the semiconductor film 13 (the low-resistance regions 13B) and the wiring line 15W and between the substrate 11 and the wiring line 15W. The insulating film 14L may have a contact hole 14H reaching the semiconductor film 13 at a position opposed to the low-resistance region 13B of the semiconductor film 13. The wiring line 15W may be electrically coupled to the semiconductor film 13 (the low-resistance region 13B) via the contact hole 14H. The insulating film 14L may include the same material as the gate insulating film 14, and may have substantially the same thickness as the gate insulating film 14.

The gate electrode 15 may be opposed to the channel region 13A of the semiconductor film 13 across the gate insulating film 14. The gate electrode 15 may control a carrier density in the channel region 13A on the basis of a gate voltage (Vg) applied thereto, and serve as a wiring line that supplies a potential. The gate electrode 15 may include one of metals including titanium (Ti), tungsten (W), tantalum (Ta), aluminum (Al), molybdenum (Mo), silver (Ag), neodymium (Nd), and copper (Cu), or an alloy of two or more of these metals. Alternatively, the gate electrode 15 may be a compound that includes one or more of these metals or may be a multi-layer film that includes two or more of these metals. For example, the gate electrode 15 may be a multi-layer film in which titanium, aluminum, and titanium are stacked in this order. Still alternatively, the gate electrode 15 may be a transparent electrically-conductive film that includes ITO, for example.

The wiring line 15W may be, for example, an electrically-conductive film formed in the same process as the gate electrode 15, namely, an electrically-conductive film formed at the same time as the gate electrode 15. The wiring line 15W may be provided between the insulating film 14L and the interlayer insulating film 17 (in one example, the metal film 16), and may be coupled to the low-resistance region 13B of the semiconductor film 13 via the contact hole 14H of the insulting film 14L. The wiring line 15W may extend from the contact hole 14H in a predetermined direction (for example, an X-axis direction in FIG. 1). The wiring line 15W may include the same material as the gate electrode 15. In one example, the wiring line 15W may be a multi-layer film in which titanium, aluminum, and titanium are stacked in this order. The wiring line 15W may have substantially the same thickness as the gate electrode 15, for example.

In the example embodiment, the semiconductor device 1 may be provided with the metal film 16 covering the wiring line 15W. The metal film 16 may have a standard electrode potential higher than that of indium. This makes it possible to suppress deterioration of the semiconductor film 13 due to an oxidation-reduction reaction of the wiring line 15W with the semiconductor film 13 and the semiconductor auxiliary films 12. This is described in detail below.

FIG. 2 illustrates standard electrode potentials of typical simple substances. A metal included in the metal film 16 has a standard electrode potential higher than a standard electrode potential (−0.338 V) of indium. In one example, the standard electrode potential of the metal included in the metal film 16 has a value larger than a value (−0.338) of the standard electrode potential of indium. The standard electrode potential of the metal included in the metal film 16 may be either a negative potential or a positive potential. Moreover, to maintain electrical conductivity of the wiring line 15W, the metal included in the metal film 16 may have relatively high electrical conductivity. For example, the metal film 16 may include molybdenum (Mo). Molybdenum has a standard electrode potential of −0.2 V. Alternatively, the metal film 16 may include ITO, copper (Cu), or silver (Ag), for example.

Such a metal film 16 may be in contact with an upper surface (a surface opposite to a surface on the substrate 11 side) of the wiring line 15W. The metal film 16 may be, for example, formed in the same patterning process as the wiring line 15W, and may have the same planar shape as the wiring line 15W. The planar shape may be a shape along the XY plane in FIG. 1. The metal film 16 may have a thickness of 10 nm to 50 nm, for example.

The metal film 16A may cover the gate electrode 15. The metal film 16A may be, for example, formed in the same process as the metal film 16. In other words, the metal film 16A may be formed at the same time as the metal film 16. The metal film 16A may be provided between the gate electrode 15 and the interlayer insulating film 17, and may be in contact with an upper surface of the gate electrode 15. The metal film 16A may be, for example, formed in the same patterning process as the gate electrode 15, and may have the same planar shape as the gate electrode 15. The metal film 16A may include the same material as the metal film 16. In one example, the metal film 16A may include molybdenum (Mo). The metal film 16A may have substantially the same thickness as the metal film 16, for example.

In one example, the interlayer insulating film 17 may extend over the entire surface of the substrate 11 to cover the metal films 16 and 16A. The interlayer insulating film 17 may be a multi-layer film that includes, for example, an interlayer insulating film 17A and an interlayer insulating film 17B, in this order from the substrate 11 side. The hole H1 is provided at a position opposed to the low-resistance region 13B of the semiconductor film 13, and may extend through the interlayer insulating film 17A and the interlayer insulating film 17B. In other words, the hole H1 may reach the low-resistance region 13B of the semiconductor film 13. The hole H2 may be provided at a position opposed to the wiring line 15W and the metal film 16, and extend through the interlayer insulating film 17A and the interlayer insulating film 17B. In other words, the hole H2 reaches the metal film 16. The hole H2 may be provided at a position not overlapping the semiconductor film 13 in plan view, for example.

The interlayer insulating film 17A may include, for example, a metal oxide film such as an aluminum oxide (AlO) film. The interlayer insulating film 17A may cover the gate electrode 15 and be in contact with the low-resistance regions 13B of the semiconductor film 13. The interlayer insulating film 17A in contact with the low-resistance regions 13B thus including a metal oxide film enables electric resistance of the low-resistance regions 13B to be maintained stably. The interlayer insulating film 17B on the interlayer insulating film 17A may be a resin film having photosensitivity, for example. In one example, the interlayer insulating film 17B may include a polyimide resin. In another example, the interlayer insulating film 17B may include a novolak resin or an acrylic resin, for example. An inorganic insulating film may be provided between the interlayer insulating film 17A and the interlayer insulating film 17B. The inorganic insulating film may include a silicon oxide (SiO) film, a silicon nitride (SiN) film, or a silicon oxynitride (SiON) film, for example. Moreover, an aluminum oxide (AlO) film, for example, may be provided between the inorganic insulating film and the interlayer insulating film 17B.

The source-drain electrode 18 provided on the interlayer insulating film 17 may serve as the source or drain of the thin-film transistor. In one example, the source-drain electrode 18 may include any of the metals and the transparent electrically-conductive film described above as the materials for the gate electrode 15. For example, the source-drain electrode 18 may include a material having high electrical conductivity. The source-drain electrode 18 may be a multi-layer film that includes, in this order, a Ti film having a thickness of 50 nm, an AlSi film having a thickness of 500 nm, and a Ti film having a thickness of 50 nm, for example. The source-drain electrode 18 may fill the hole H1 of the interlayer insulating film 17 to be in contact with the semiconductor film 13 (the low-resistance region 13B).

The lead-out wiring line 19 may be provided on the interlayer insulating film 17, and extend in a predetermined direction (for example, the X-axis direction in FIG. 1). The lead-out wiring line 19 may fill the hole H2 of the interlayer insulating film 17 to be in contact with the metal film 16. In other words, the lead-out wiring line 19 may be electrically coupled to the semiconductor film 13 (the low-resistance region 13B) via the metal film 16 and the wiring line 15W. The lead-out wiring line 19 may serve as a data line, for example, of a display (the display 2A described below).

[Manufacturing Method]

Figure 3:
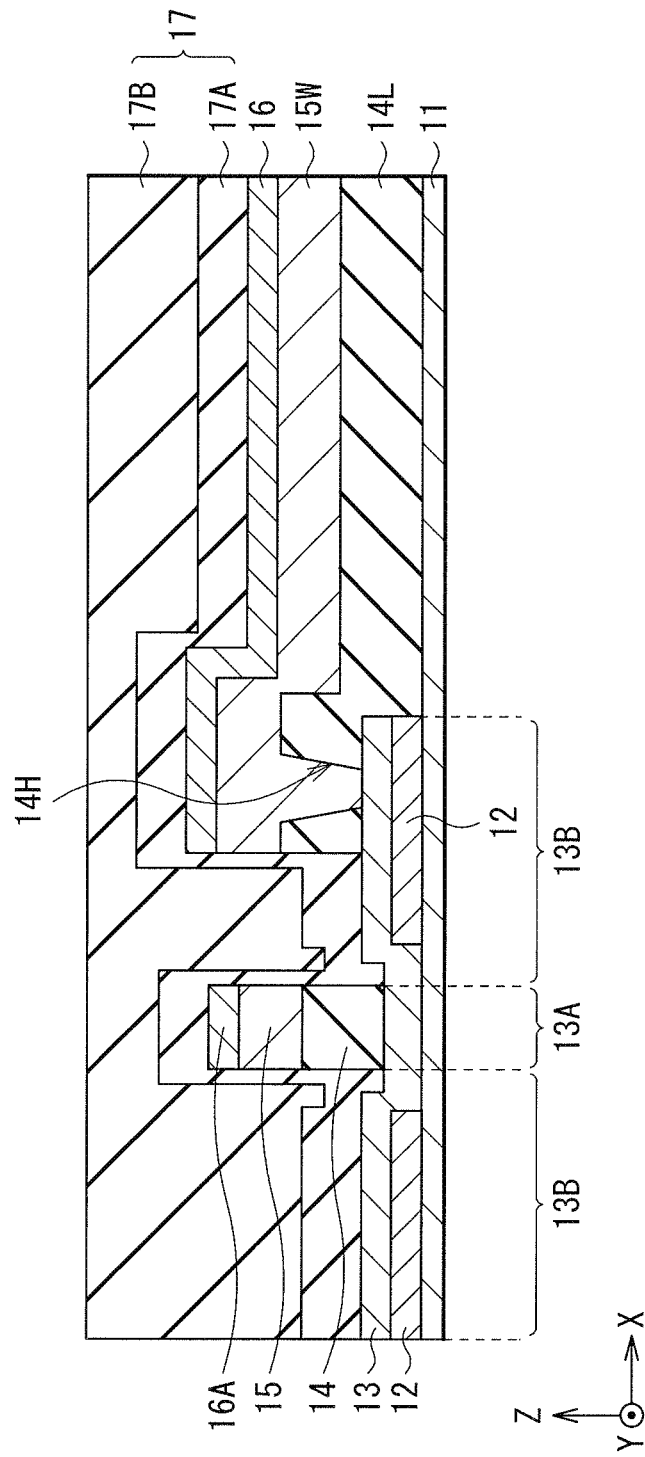
FIG. 3 is a schematic cross-sectional diagram illustrating an example process of a method for manufacturing the semiconductor device of FIG. 1.
Figure 4:
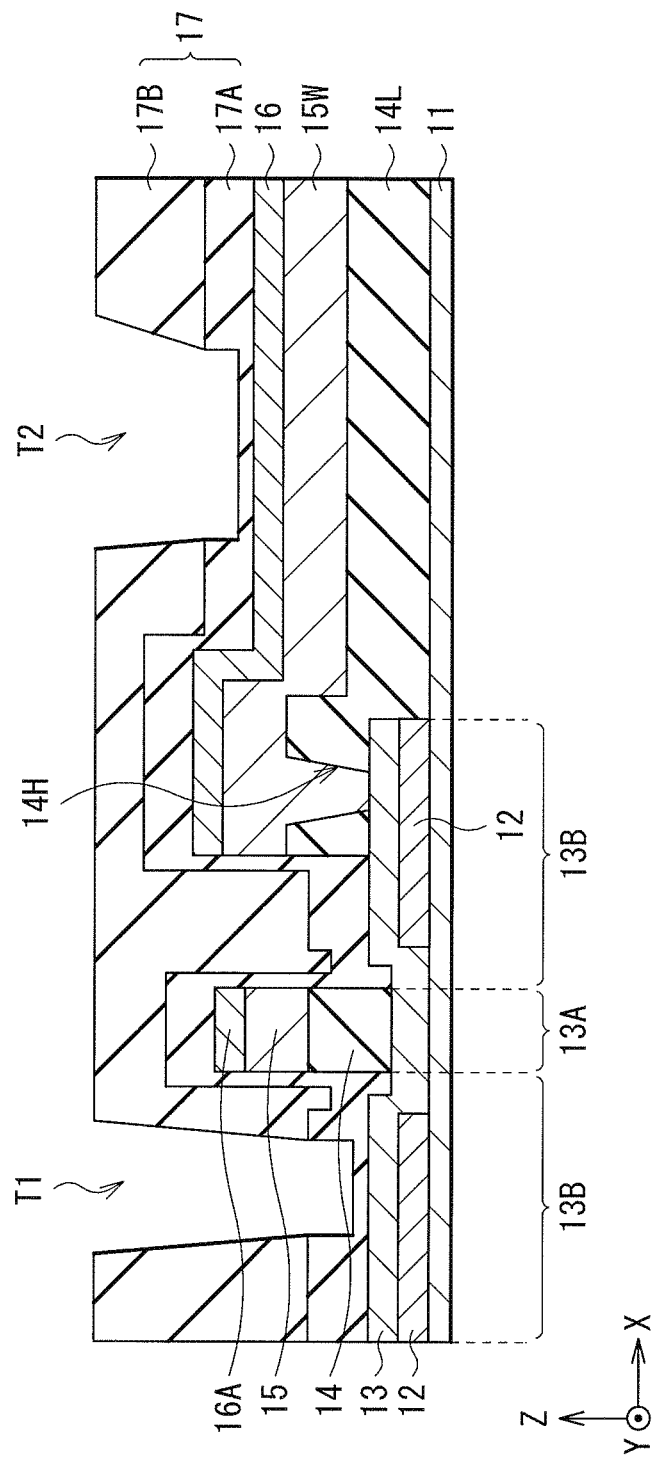
FIG. 4 is a schematic cross-sectional diagram illustrating an example process following the process of FIG. 3.

The semiconductor device 1 described above may be manufactured through the following example processes illustrated in FIGS. 3 and 4.

Firstly, with reference to FIG. 3, the semiconductor auxiliary films 12, the semiconductor film 13, the gate insulating film 14, the gate electrode 15, the metal film 16A, and the interlayer insulating film 17 may be formed in this order on the substrate 11. For example, these layers may be formed as follows. The semiconductor auxiliary films 12 may be formed first on the substrate 11. For example, the semiconductor auxiliary film 12 may be formed as follows. Firstly, an IZO film may be formed by sputtering, for example, over the entire surface of the substrate 11. Thereafter, the IZO film may be patterned into a predetermined shape by photolithography and wet-etching. The semiconductor auxiliary films 12 may be thereby formed in selective regions on the substrate 11.

For example, the semiconductor film 13 may be formed as follows. Firstly, an oxide semiconductor film may be formed over the entire surface of the substrate 11 by sputtering, for example, and may be patterned into a predetermined shape by photolithography and wet-etching, for example. At this stage, patterning may be performed to cause portions (the low-resistance regions 13B) of the semiconductor film 13 to cover the semiconductor auxiliary films 12. The semiconductor film 13 may be thereby formed.

After the formation of the semiconductor film 13, an insulating film including silicon oxide (SiO) having a thickness of 200 nm may be formed over the entire surface of the substrate 11 by CVD, for example, so as to cover the semiconductor film 13. The insulating film may be formed into the gate insulating film 14 and the insulating film 14L in a later process. Next, the contact hole 14H may be formed at a position of the insulating film that is opposed to the semiconductor auxiliary film 12 (the low-resistance region 13B of the semiconductor film 13). Then, an electrically conductive film may be formed on the insulating film. The electrically conductive film may be formed by stacking titanium (Ti), aluminum (Al), and titanium in this order, for example. The electrically conductive film may be formed into the gate electrode 15 and the wiring line 15W in a later process. Thereafter, a metal film including molybdenum (Mo), for example, may be formed on the electrically conductive film. The metal film may be formed into the metal films 16 and 16A in a later process.

Next, a photoresist having a predetermined pattern may be formed on the metal film. With the use of the photoresist, the metal film, the electrically conductive film, and the insulating film may be sequentially patterned. This enables the metal film 16A, the gate electrode 15, the gate insulating film 14, the metal film 16, the wiring line 15W, and the insulating film 14L to be formed. For example, at this stage, portions of the semiconductor film 13 uncovered with the gate insulating film 14 may be processed to have a low resistance by dry-etching, so that the low-resistance regions 13B may be thereby formed. Thereafter, the interlayer insulating film 17 may be formed over the entire surface of the substrate 11 to cover the metal films 16 and 16A.

Thereafter, as illustrated in FIG. 4, trenches T1 and T2 may be formed in the interlayer insulating film 17 by photolithography and dry-etching, for example. The trench T1 may be formed at a position opposed to the low-resistance region 13B of the semiconductor film 13, and the trench T2 may be formed at a position opposed to the metal film 16. The trenches T1 and T2 may be formed to have the interlayer insulating film 17A left thin at bottoms. For example, the interlayer insulating film 17A of about several nanometers may be left at the bottoms of the trenches T1 and T2. Thus, even if the interlayer insulating film 17, for example, is soaked in a developing solution in forming the trenches T1 and T2, the developing solution is less likely to penetrate into the semiconductor film 13 and the metal film 16 below the interlayer insulating film 17. This makes an oxidation-reduction reaction via the developing solution less likely to occur between the semiconductor film 13 and the wiring line 15W. The developing solution may include, for example, tetramethylammonium hydroxide (TMAH).

After the formation of the trenches T1 and T2, the holes H1 and H2 may be formed by removing the interlayer insulating film 17A at the bottoms of the trenches T1 and T2. Thereafter, the source-drain electrode 18 and the lead-out wiring line 19 may be formed on the interlayer insulating film 17. In this manner, the semiconductor device 1 illustrated in FIG. 1 may be completed.

[Example Operation]

In the semiconductor device 1 according to the example embodiment of the technology, the channel region 13A of the semiconductor film 13 may be activated upon application of an ON voltage equal to or greater than a threshold voltage to the gate electrode 15. This causes an electrical current to flow between the paired low-resistance regions 13B.

[Example Workings and Effects]

In the semiconductor device 1 according to the example embodiment, the metal film 16 covering the wiring line 15W may have a standard electrode potential higher than that of indium. This makes it possible to suppress deterioration of the semiconductor film 13 due to an oxidation-reduction reaction of the wiring line 15W with the semiconductor film 13 and the semiconductor auxiliary films 12. This effect will now be described with reference to a comparative example.

Figure 5:
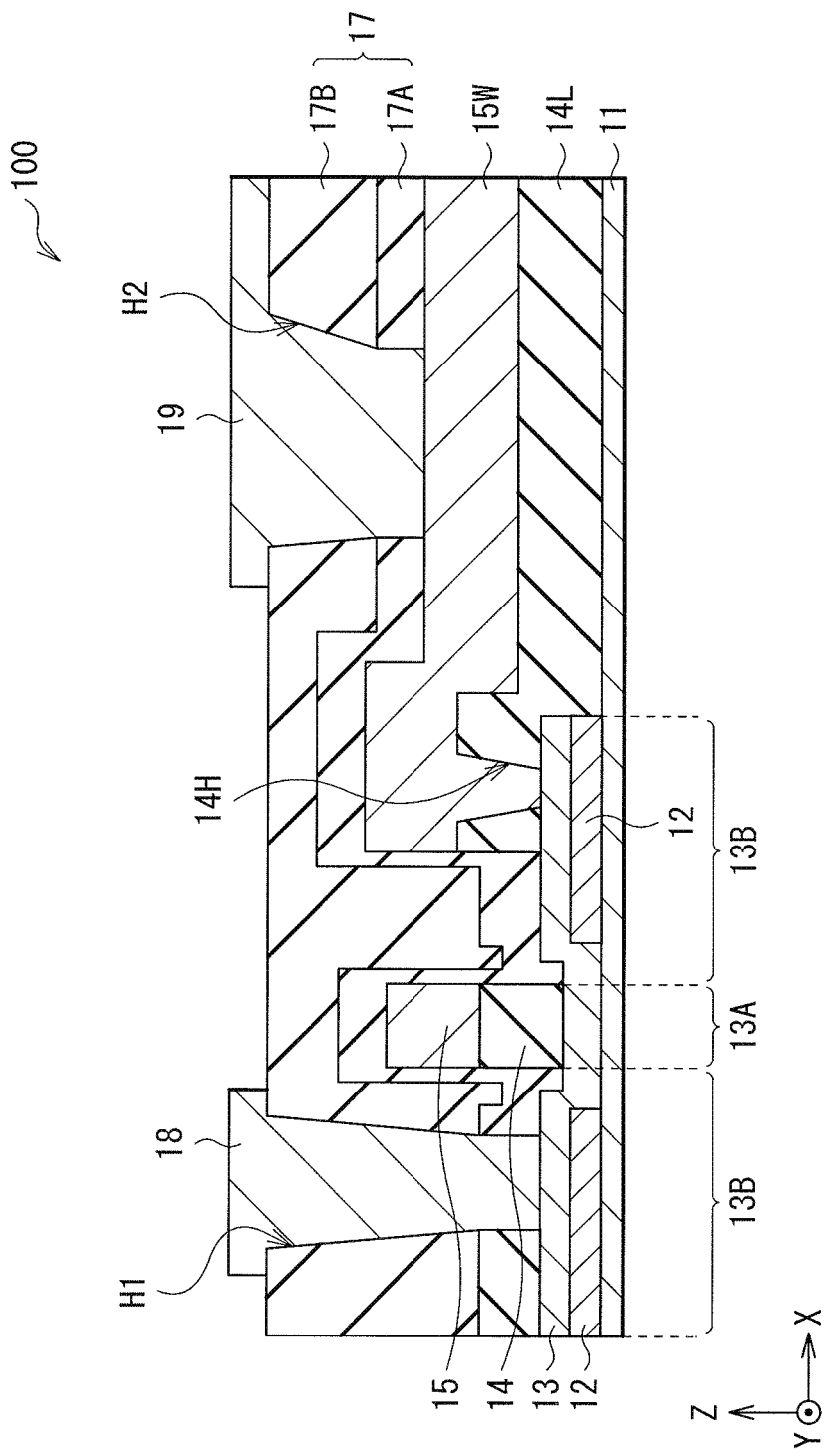
FIG. 5 is a schematic cross-sectional diagram illustrating an example configuration of a main part of a semiconductor device according to a comparative example.

FIG. 5 illustrates a schematic cross-sectional configuration of a main part of a semiconductor device 100 according to a comparative example. FIG. 5 corresponds to FIG. 1 illustrating the semiconductor device 1. The semiconductor device 100 includes the semiconductor auxiliary films 12, the semiconductor film 13, the gate insulating film 14, the gate electrode 15, the interlayer insulating film 17, and the source-drain electrode 18 on the substrate 11. The source-drain electrode 18 is electrically coupled to the low-resistance region 13B of the semiconductor film 13 via the hole H1 of the interlayer insulating film 17. The semiconductor device 100 also includes the wiring line 15W electrically coupled to the low-resistance region 13B of the semiconductor film 13, and the lead-out wiring line 19. The lead-out wiring line 19 is electrically coupled to the wiring line 15W via the hole H2 of the interlayer insulating film 17. The semiconductor device 100 does not include a metal film (the metal films 16 and 16A in FIG. 1) covering the wiring line 15W and the gate electrode 15. The semiconductor device 100 differs from the semiconductor device 1 in this point.

Figure 6:
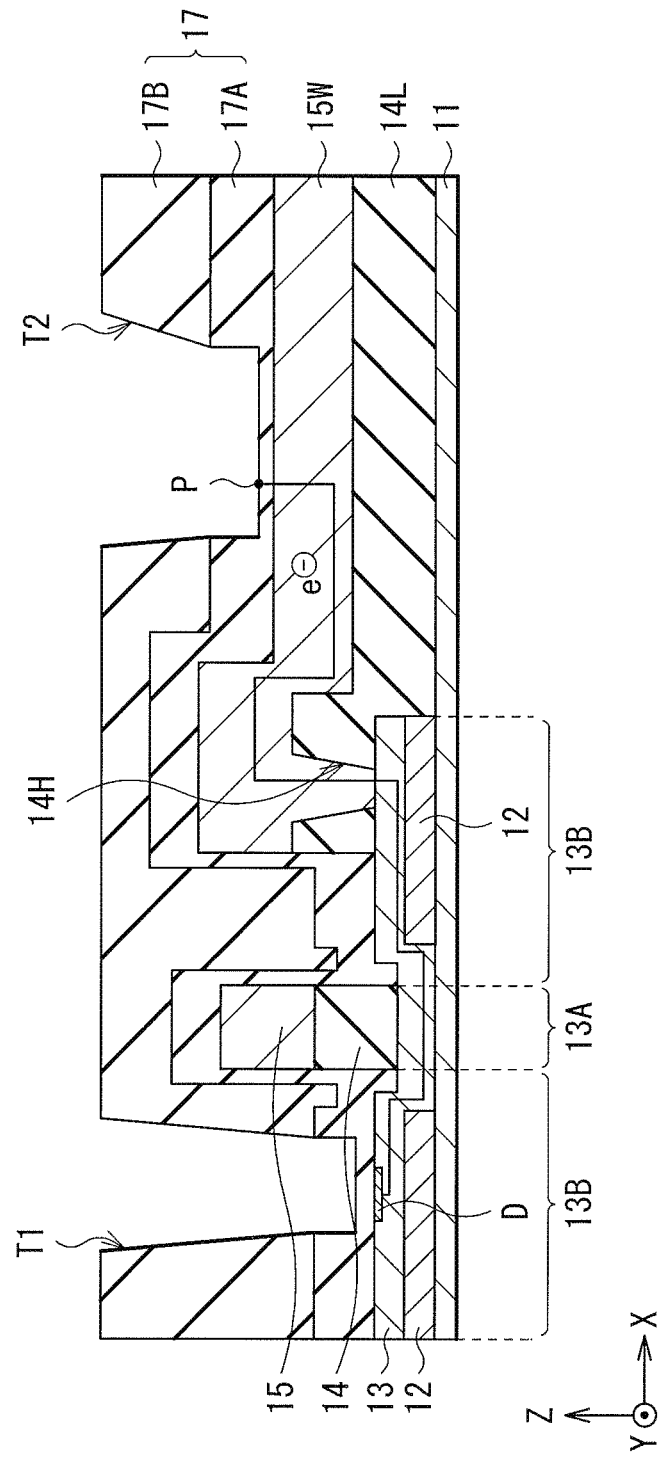
FIG. 6 is a schematic cross-sectional diagram illustrating an example process of a method for manufacturing the semiconductor device of FIG. 5.

FIG. 6 illustrates an example process of a method for manufacturing the semiconductor device 100. FIG. 6 corresponds to FIG. 4 illustrating a process for manufacturing the semiconductor device 1. In the semiconductor device 100, the trenches T1 and T2 are formed in the interlayer insulating film 17 after the formation of the interlayer insulating film 17, as in the semiconductor device 1. At this stage, the interlayer insulating film 17A is left thin at the bottoms of the trenches T1 and T2. However, when the interlayer insulating film 17, for example, is soaked in a developing solution in forming the trenches T1 and T2, the developing solution can penetrate into a layer below the interlayer insulating film 17 via pin holes of the interlayer insulating film 17A. Moreover, the trenches T1 and T2 are formed by dry-etching, for example. In this process, it is technically difficult to leave the interlayer insulating film 17A thin throughout the trenches T1 and T2, and the interlayer insulating film 17A can be removed completely in some portions of the trenches T1 and T2.

Entering the wiring line 15W and the semiconductor film 13, the developing solution causes an oxidation-reduction reaction of the wiring line 15W with the semiconductor film 13 and the semiconductor auxiliary films 12, as in FIG. 6. Titanium (Ti), for example, included in the wiring line 15W has a low standard electrode potential. For example, the standard electrode potential of titanium is −1.63V as in FIG. 2. Thus, a difference tends to be large between a standard electrode potential (−0.338V) of indium (In) included in the semiconductor film 13 and the semiconductor auxiliary films 12, and a standard electrode potential of a metal, such as titanium, included in the wiring line 15W. This can cause an oxidation-reduction reaction via a developing solution (e.g., TMAH) between titanium and indium, for example. Thus, indium having a higher standard electrode potential can be precipitated near the trench T1, for example, as a precipitate D in FIG. 6. In one example, providing the semiconductor auxiliary films 12 having a higher indium concentration than the semiconductor film 13 in contact with the semiconductor film 13 causes indium to be precipitated more easily. Such precipitation of indium causes electrolytic corrosion, causing abnormality in Vg-Id characteristics, for example.

In contrast, in the semiconductor device 1, the metal film 16 covering the wiring line 15W may have a standard electrode potential higher than that of indium. Thus, even if a developing solution penetrates into a layer below the interlayer insulating film 17 (e.g., the metal film 16) via pin holes of the interlayer insulating film 17A, it is possible to suppress precipitation of indium due to an oxidation-reduction reaction. This makes it possible to suppress deterioration in characteristics due to deterioration of the semiconductor film 13.

Moreover, in the semiconductor device 1, the semiconductor film 13 is less likely to deteriorate as described above, even if the interlayer insulating film 17A is completely removed in portions of the trenches T1 and T2 in forming the trenches T1 and T2. This eliminates the need to strictly maintain in-plane uniformity in dry-etching for forming the trenches T1 and T2. In other words, a process margin is widened in dry-etching. Accordingly, an embodiment of the technology is able to be suitably used for the semiconductor device 1 having a large area.

As described above, in the example embodiment, the metal film 16 covering the wiring line 15W may have a standard electrode potential higher than that of indium. This makes it possible to suppress deterioration in characteristics due to deterioration of the semiconductor film 13. Consequently, it is possible to suppress deterioration in characteristics.

Moreover, the semiconductor device 1 has a wider process margin, which facilitates manufacture.

APPLICATION EXAMPLE 1

Display and Imaging Unit

The semiconductor device 1 that is described in the example embodiment described above may be applied to driving circuits of a display, such as the display 2A illustrated in FIG. 7 described below, and an imaging unit, such as the imaging unit 2B illustrated in FIG. 8 described below.

Figure 7:
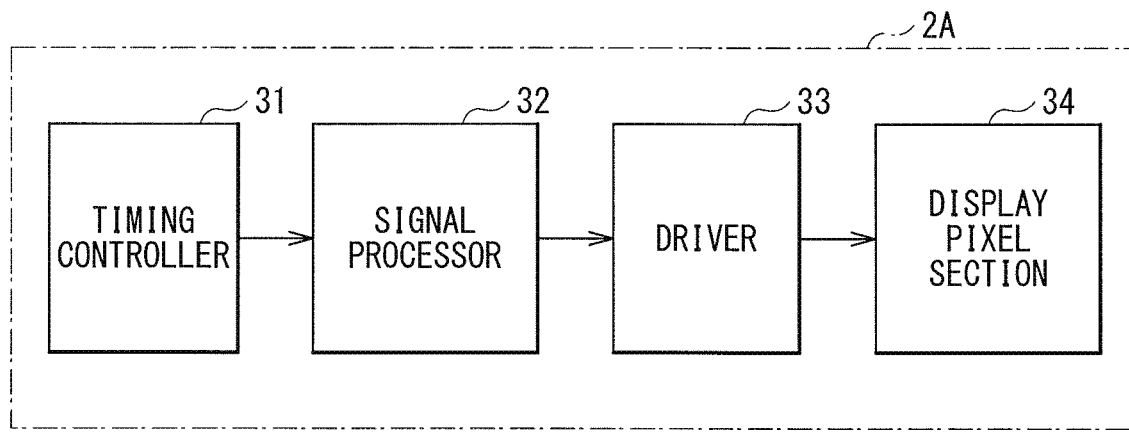
FIG. 7 is a block diagram illustrating an example configuration of a display to which the semiconductor device of FIG. 1 is applied.

FIG. 7 is a block diagram of the display 2A. The display 2A may display an external or internal image signal in the form of an image. The display 2A may be applied to, for example, a liquid crystal display as well as the organic EL display described above. The display 2A may include, for example, a timing controller 31, a signal processor 32, a driver 33, and a display pixel section 34.

The timing controller 31 may include a timing generator that generates various timing signals or control signals. The timing controller 31 may control driving of the signal processor 32 on the basis of the various timing signals, for example. The signal processor 32 may perform a predetermined correction of an external digital image signal, for example, and may output the corrected image signal to the driver 33. The driver 33 may include, for example, a scanning-line driving circuit and a signal-line driving circuit, and may drive pixels in the display pixel section 34 via various control lines. The display pixel section 34 may include, for example, a display element, such as an organic electroluminescent element or a liquid crystal display element, and a pixel circuit that drives the display element on a pixel basis. The semiconductor device 1 may be used in any circuit serving as a portion of the driver 33 or a portion of the display pixel section 34, for example.

Figure 8:
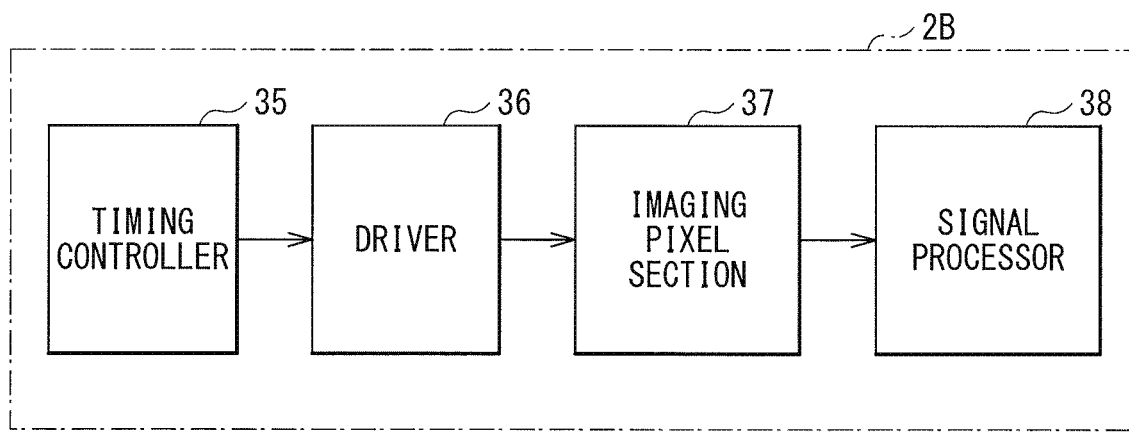
FIG. 8 is a block diagram illustrating an example configuration of an imaging unit to which the semiconductor device 1 of FIG. 1 is applied.

FIG. 8 is a block diagram of the imaging unit 2B. The imaging unit 2B may be a solid-state imaging unit that acquires an image as an electric signal, for example. The imaging unit 2B may include, for example, a charge coupled device (CCD) or a complementary metal oxide semiconductor (CMOS) image sensor. The imaging unit 2B may include, for example, a timing controller 35, a driver 36, an imaging pixel section 37, and a signal processor 38.

The timing controller 35 may include a timing generator that generates various timing signals or control signals. The timing controller 35 may control driving of the driver 36 on the basis of the various timing signals. The driver 36 may include a row selection circuit, an AD converter circuit, and a horizontal transfer scanning circuit, for example. The driver 36 may read a signal from each pixel in the imaging pixel section 37 through various control lines. The imaging pixel section 37 may include, for example, an imaging element, such as a photoelectric transducer or a photodiode, and a pixel circuit that reads signals. The signal processor 38 may perform various processes of the signals received from the imaging pixel section 37. The semiconductor device 1 described above may be used in various circuits that serve as a portion of the driver 36 or a portion of the imaging pixel section 37.

APPLICATION EXAMPLE 2

Electronic Apparatus

Figure 9:
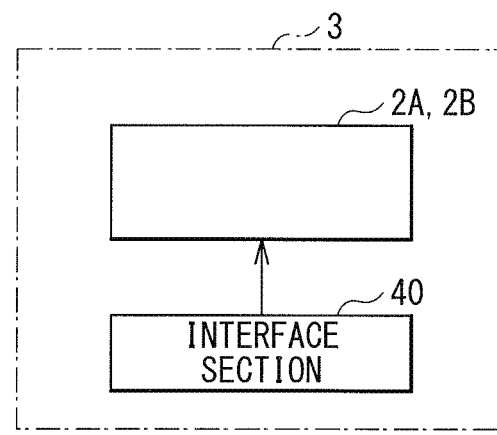
FIG. 9 is a block diagram illustrating an example configuration of an electronic apparatus according to one embodiment of the technology.

The display 2A and the imaging unit 2B may be applied to a variety of electronic apparatuses. FIG. 9 is a block diagram of an electronic apparatus 3. Specific but non-limiting examples of the electronic apparatus 3 may include television apparatuses, personal computers (PCs), smartphones, tablet PCs, mobile phones, digital still cameras, and digital video cameras.

The electronic apparatus 3 may include, for example, the display 2A or the imaging unit 2B described above, and an interface section 40. The interface section 40 may be an input section that receives various external signals and electric power. The interface section 40 may include a user interface, such as a touch panel, a keyboard, or operational buttons.

Although the technology is described with reference to the example embodiments and application examples hereinabove, these example embodiments and application examples are not to be construed as limiting the scope of the technology and may be modified in a wide variety of ways. For example, the materials and thicknesses of the layers described in the example embodiments should not be limited to those described above, and may be different from those described above.

In the example embodiments and application examples described above, the semiconductor auxiliary films 12 may be in contact with the lower surface of the semiconductor film 13. Alternatively, the semiconductor auxiliary films 12 may be in contact with the upper surface of the semiconductor film 13.

It should be appreciated that the effects described herein are mere examples. Effects of the example embodiment of the technology are not limited to those described herein, and may be different from those described herein. The technology may further include any effects other than those described herein.

It is possible to achieve at least the following configurations from the foregoing example embodiments of the technology.

(1) A semiconductor device including:
a semiconductor film including a channel region and a low-resistance region having a lower electric resistance than the channel region, the semiconductor film including indium and oxygen;
a semiconductor auxiliary film that is in contact with the low-resistance region of the semiconductor film and reduces the electric resistance of the semiconductor film;
a wiring line electrically coupled to the low-resistance region of the semiconductor film;
a first metal film that covers the wiring line and has a standard electrode potential higher than a standard electrode potential of the indium; and
an interlayer insulating film that covers the semiconductor film with the first metal film interposed between the interlayer insulating film and the semiconductor film, the interlayer insulating film having a first hole and a second hole, the first hole being provided at a position opposed to the low-resistance region of the semiconductor film, the second hole reaching the first metal film.

(2) The semiconductor device according to (1), in which the semiconductor auxiliary film includes a metal or a metal oxide.

(3) The semiconductor device according to (2), in which the semiconductor auxiliary film includes the indium.

(4) The semiconductor device according to (3), in which the indium included in the semiconductor auxiliary film has a concentration higher than a concentration of the indium included in the semiconductor film.

(5) The semiconductor device according to any one of (1) to (4), in which the first metal film includes molybdenum.

(6) The semiconductor device according to any one of (1) to (5), in which the first metal film is in contact with the wiring line.

(7) The semiconductor device according to any one of (1) to (6), further including:
a substrate;
a gate electrode opposed to the channel region; and
a gate insulating film provided between the gate electrode and the semiconductor film, in which the semiconductor auxiliary film, the semiconductor film, the gate insulating film, and the gate electrode are provided on the substrate in this order.

(8) The semiconductor device according to (7), in which the gate electrode includes a same material as a material of the wiring line.

(9) The semiconductor device according to (7) or (8), further including a second metal film that covers the gate electrode and includes a same material as a material of the first metal film.

(10) The semiconductor device according to any one of (1) to (9), further including a source-drain electrode electrically coupled to the low-resistance region of the semiconductor film via the first hole of the interlayer insulating film.

(11) The semiconductor device according to any one of (1) to (10), in which the wiring line includes titanium.

(12) The semiconductor device according to any one of (1) to (11), in which the semiconductor auxiliary film is selectively disposed in a portion that is opposed to the low-resistance region out of the channel region and the low-resistance region of the semiconductor film.

(13) A display with a display element and a semiconductor device that drives the display element, the semiconductor device including:

a semiconductor film including a channel region and a low-resistance region having a lower electric resistance than the channel region, the semiconductor film including indium and oxygen;

a semiconductor auxiliary film that is in contact with the low-resistance region of the semiconductor film and reduces the electric resistance of the semiconductor film;

a wiring line electrically coupled to the low-resistance region of the semiconductor film;

a first metal film that covers the wiring line and has a standard electrode potential higher than a standard electrode potential of the indium; and an interlayer insulating film that covers the semiconductor film with the first metal film interposed between the interlayer insulating film and the semiconductor film, the interlayer insulating film having a first hole and a second hole, the first hole being provided at a position opposed to the low-resistance region of the semiconductor film, the second hole reaching the first metal film.

In the semiconductor device and the display according to an example embodiment of the technology, the first metal film covering the wiring line may have a standard electrode potential higher than that of indium. This makes it possible to suppress deterioration of the semiconductor film due to an oxidation-reduction reaction of the wiring line with the semiconductor film and the semiconductor auxiliary film.

In the semiconductor device and the display according to an example embodiment of the technology, the first metal film covering the wiring line may have a standard electrode potential higher than that of indium. This makes it possible to suppress deterioration in characteristics due to deterioration of the semiconductor film. Consequently, it is possible to suppress deterioration in characteristics. It is to be noted that effects of the example embodiments and application examples of the technology should not be limited to those described hereinabove, and may be any effect described herein.

Although the technology is described hereinabove in terms of example embodiments, it is not limited thereto. It should be appreciated that variations may be made in the described example embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:

1. A semiconductor device comprising:
a semiconductor film including a channel region and a low-resistance region having a lower electric resistance than the channel region, the semiconductor film including indium and oxygen;
a semiconductor auxiliary film that is in contact with a bottom surface of the low-resistance region of the semiconductor film and reduces the electric resistance of the semiconductor film;
a wiring line electrically coupled to the low-resistance region of the semiconductor film;
a first metal film that covers the wiring line and has a standard electrode potential higher than a standard electrode potential of indium; and
an interlayer insulating film that covers the semiconductor film with the first metal film interposed between the interlayer insulating film and the semiconductor film, the interlayer insulating film having a first hole and a second hole, the first hole being provided at a position opposed to the low-resistance region of the semiconductor film, the second hole reaching the first metal film.

2. The semiconductor device according to claim 1, wherein the semiconductor auxiliary film includes a metal or a metal oxide.

3. The semiconductor device according to claim 2, wherein the semiconductor auxiliary film includes indium.

4. The semiconductor device according to claim 3, wherein the indium included in the semiconductor auxiliary film has a concentration higher than a concentration of indium included in the semiconductor film.

5. The semiconductor device according to claim 1, wherein the first metal film includes molybdenum.

6. The semiconductor device according to claim 1, wherein the first metal film is in contact with the wiring line.

7. The semiconductor device according to claim 1, further comprising:
a substrate;
a gate electrode opposed to the channel region; and
a gate insulating film provided between the gate electrode and the semiconductor film,
wherein the semiconductor auxiliary film, the semiconductor film, the gate insulating film, and the gate electrode are provided on the substrate in this order.

8. The semiconductor device according to claim 7, wherein the gate electrode includes a same material as a material of the wiring line.

9. The semiconductor device according to claim 7, further comprising a second metal film that covers the gate electrode and includes a same material as a material of the first metal film.

10. The semiconductor device according to claim 1, further comprising a source-drain electrode electrically coupled to the low-resistance region of the semiconductor film via the first hole of the interlayer insulating film.

11. The semiconductor device according to claim 1, wherein the wiring line includes titanium.

12. The semiconductor device according to claim 1, wherein the semiconductor auxiliary film is selectively disposed in a portion that is opposed to the low-resistance region out of the channel region and the low-resistance region of the semiconductor film.

13. A display with a display element and a semiconductor device that drives the display element, the semiconductor device comprising:

a semiconductor film including a channel region and a low-resistance region having a lower electric resistance than the channel region, the semiconductor film including indium and oxygen;

a semiconductor auxiliary film that is in contact with a bottom surface of the low-resistance region of the semiconductor film and reduces the electric resistance of the semiconductor film;

a wiring line electrically coupled to the low-resistance region of the semiconductor film;

a first metal film that covers the wiring line and has a standard electrode potential higher than a standard electrode potential of indium; and an interlayer insulating film that covers the semiconductor film with the first metal film interposed between the interlayer insulating film and the semiconductor film, the interlayer insulating film having a first hole and a second hole, the first hole being provided at a position opposed to the low-resistance region of the semiconductor film, the second hole reaching the first metal film.

* * * * *